United States Patent
Ku et al.

(10) Patent No.: US 7,056,794 B2
(45) Date of Patent: Jun. 6, 2006

(54) FET GATE STRUCTURE WITH METAL GATE ELECTRODE AND SILICIDE CONTACT

(75) Inventors: Victor Ku, Yorktown Heights, NY (US); An Steegen, Stamford, CT (US); Hsing-Jen C. Wann, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 10/707,757

(22) Filed: Jan. 9, 2004

(65) Prior Publication Data

US 2005/0153530 A1    Jul. 14, 2005

(51) Int. Cl.
*H01L 21/336* (2006.01)
*H01L 29/76* (2006.01)

(52) U.S. Cl. ............... 438/287; 438/649; 438/651; 438/655; 438/682; 257/412; 257/754

(58) Field of Classification Search ............... 438/287, 438/299, 642, 648–649, 651, 655–656, 682–683; 257/412, 413, 763, 764, 754, 757
See application file for complete search history.

(56) References Cited

U.S. PATENT DOCUMENTS

| | | | |
|---|---|---|---|
| 4,745,079 A | | 5/1988 | Pfiester |
| 5,619,057 A | | 4/1997 | Komatsu |
| 5,960,270 A | * | 9/1999 | Misra et al. ............... 438/197 |
| 6,171,910 B1 | * | 1/2001 | Hobbs et al. ............... 438/275 |
| 6,251,778 B1 | * | 6/2001 | Fang et al. ............... 438/682 |
| 6,319,807 B1 | * | 11/2001 | Yeh et al. ............... 438/595 |
| 6,355,531 B1 | | 3/2002 | Mandelman et al. |
| 6,373,111 B1 | | 4/2002 | Zheng et al. |
| 6,376,888 B1 | | 4/2002 | Tsunashima et al. |
| 6,392,280 B1 | * | 5/2002 | Besser et al. ............... 257/410 |
| 6,501,131 B1 | | 12/2002 | Divakaruni et al. |
| 6,534,390 B1 | * | 3/2003 | Chong et al. ............... 438/592 |
| 2002/0086504 A1 | | 7/2002 | Park et al. |
| 2002/0123189 A1 | | 9/2002 | Cha et al. |
| 2002/0179975 A1 | | 12/2002 | Wakabayashi et al. |
| 2003/0011037 A1 | | 1/2003 | Chau et al. |
| 2003/0075766 A1 | | 4/2003 | Lin et al. |
| 2003/0119292 A1 | | 6/2003 | Lee et al. |

* cited by examiner

*Primary Examiner*—Kevin M. Picardat
(74) *Attorney, Agent, or Firm*—Ira D. Blecker

(57) ABSTRACT

A method is provided for fabricating a single-metal or dual metal replacement gate structure for a semiconductor device; the structure includes a silicide contact to the gate region. A dummy gate structure and sacrificial gate dielectric are removed to expose a portion of the substrate; a gate dielectric is formed thereon. A metal layer is formed overlying the gate dielectric and the dielectric material. This metal layer may conveniently be a blanket metal layer covering a device wafer. A silicon layer is then formed overlying the metal layer; this layer may also be a blanket wafer. A planarization or etchback process is then performed, so that the top surface of the dielectric material is exposed while other portions of the metal layer and the silicon layer remain in the gate region and have surfaces coplanar with the top surface of the dielectric material. A silicide contact is then formed which is in contact with the metal layer in the gate region.

20 Claims, 14 Drawing Sheets

FET GATE STRUCTURE WITH METAL GATE ELECTRODE AND SILICIDE CONTACT

This application is related to application Ser. No. 10/707,759, "Method of forming FET silicide gate structures incorporating inner spacers," filed the same day and assigned to the same assignee as the present application. The disclosure of the above-noted application is incorporated herein by reference.

BACKGROUND OF INVENTION

This invention relates to the manufacture of advanced semiconductor devices, particularly advanced CMOS integrated devices in which metal gate electrodes are used.

With the continued scaling of CMOS devices to smaller dimensions, the gate dielectrics of these devices have been reduced to thicknesses well below 20 Å. This in turn has led to greatly increased gate leakage currents and diffusion of dopants from the polysilicon gate structures (often referred to as the poly depletion effect).

Metal gates are now being used to mitigate the poly depletion effect and control the leakage current, and thus to ensure electrical performance in highly integrated CMOS devices. A metal gate is typically formed by a "replacement gate" process, in which a dummy polysilicon gate is first formed and then removed, and a metal gate formed in its place. The metal gate may span both n+ and p+ gate areas and comprise a single metal with a midgap work function. Alternatively, the replacement gate may comprise two metals with different work functions, in the space previously occupied by the n+ and p+ polysilicon gates respectively.

As an example of the present state of the art, U.S. patent application Publication No. 2003/0119292 of Lee et al., "Integration of dual workfunction metal gate CMOS devices," describes a replacement-gate process for forming a metal gate in which a doped polysilicon gate is formed and then removed, leaving an open trench; a bulk metal layer is deposited in the trench and then planarized to yield a metal gate. This approach may present manufacturing problems in two ways. First, a very narrow gate structure (corresponding to a very short channel length, perhaps less than 70 nm) results in a high-aspect-ratio trench which may be difficult to fill without introducing a void in the metal. Second, a metal planarization process (typically chemical-mechanical polishing or CMP) is susceptible to dishing effects which cause nonuniformities in the metal thickness (and thus in the height of the metal gate).

It is also desirable to provide a silicided contact for the metal gate electrode. Accordingly, there is a need for a metal gate CMOS device with a silicide contact thereto, which is easily manufacturable and applicable to both a midgap replacement gate and a dual-metal replacement gate.

SUMMARY OF INVENTION

The present invention addresses the above-described need by providing a method for fabricating a semiconductor device having a gate structure on a substrate. According to a first aspect of the invention, the method begins with removal of material in a gate region of the device (that is, removal of a dummy gate structure and sacrificial gate dielectric) to expose a portion of the substrate. A gate dielectric is formed on the exposed portion of the substrate, and a metal layer is formed overlying the gate dielectric and the dielectric material. This metal layer may conveniently be a blanket metal layer covering a device wafer. A silicon layer is then formed overlying the metal layer; this layer may also be a blanket wafer. A planarization or etchback process is then performed in which portions of the metal layer and the silicon layer are removed, so that the top surface of the dielectric material is exposed while other portions of the metal layer and the silicon layer remain in the gate region and have surfaces coplanar with the top surface of the dielectric material. A silicide contact is then formed which is in contact with the metal layer in the gate region.

The silicide contact may be formed by depositing a layer of a silicide-forming metal (Ni, Co, Ta, W or Mo) over the gate region; performing a siliciding process to form a metal silicide including silicon from the portion remaining in the gate region and the silicide-forming metal; and performing a planarization process to expose the top surface of the dielectric material.

The removal of the dummy gate material may be viewed as forming a trench, where the bottom is the exposed portion of the substrate. The step of forming the gate dielectric thus covers the bottom of the trench, while the step of forming the metal layer thus forms metal on the sidewalls of the trench; the step of forming the silicon layer fills the trench. The silicon is afterwards converted to a silicide, so that the trench is filled with the silicide contact, the metal gate being a layer on the sidewalls and overlying the gate dielectric on the bottom of the trench.

According to a second aspect of the invention, two metal layers are formed in the gate region, so that a dual-metal gate structure is formed. In this method, material is removed from a first portion of the gate region, and afterwards from a second portion of the gate region, exposing portions of the substrate. The gate dielectric is formed on the exposed portions of the substrate. A first metal layer and a first silicon layer are formed overlying the gate dielectric and then planarized. A portion of the first metal layer is oxidized; this metal oxide layer separates the first and second metal layers. The second metal layer and second silicon layer are formed, and then planarized. A silicide contact is then formed in the gate region, in contact with both planarized portions of the first and second metal layers.

The silicide contact may be formed by forming a third silicon layer overlying both portions of the gate region; depositing a layer of a silicide-forming metal thereon; and performing a siliciding process. The siliciding process forms a metal silicide including silicon from remaining portions of the first and second silicon layers and from the third silicon layer, and metal from the layer of silicide-forming metal. A planarization process is then performed to expose the top surface of the dielectric material. The metal and metal oxide may be partially removed from the gate region so that the metal layers and oxide layer are recessed with respect to the top surface of the adjacent dielectric material. The third silicon layer then fills the recess, so that the silicide later likewise fills the recess.

According to another aspect of the invention, a semiconductor device having a gate structure on a substrate is provided. The gate structure of the device is fabricated as either a single-metal or dual-metal replacement gate, in accordance with the methods described above.

DETAILED DESCRIPTION

Figure 1A:
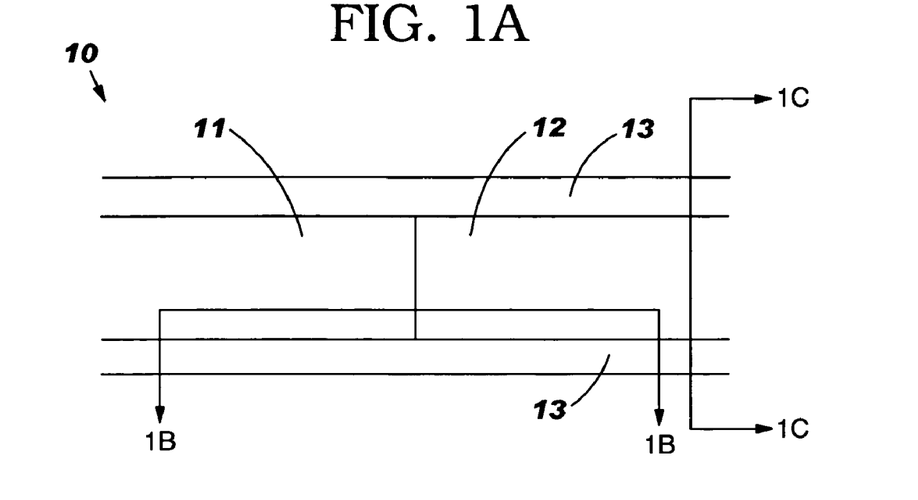
FIG. 1A is a schematic illustration in plan view of a typical CMOS dummy gate structure with n+ and p+ polysilicon regions.
Figure 1B:
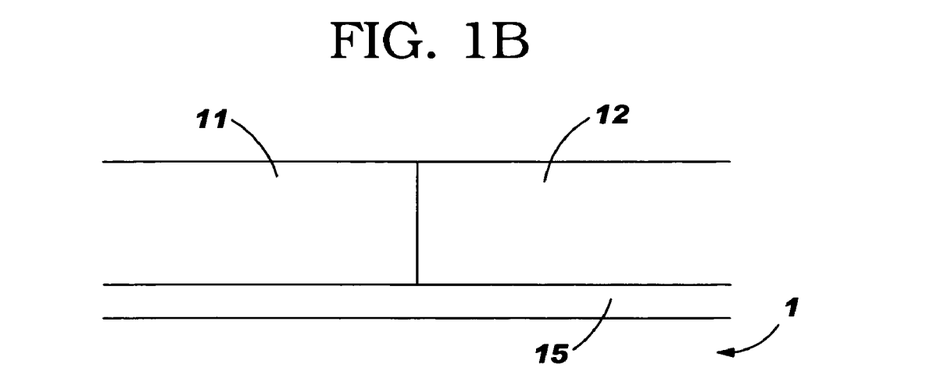
FIG. 1B is a longitudinal cross-section view of the gate regions of FIG. 1A
Figure 1C:
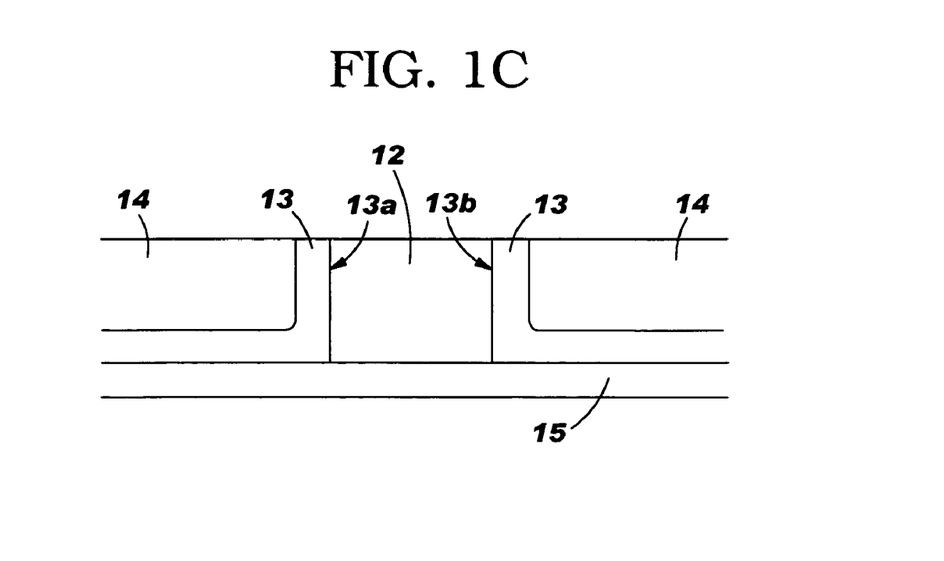
FIG. 1C is a transverse cross-section view of the gate regions of FIG. 1A.

The embodiments of the invention will be described as part of a replacement-gate process, in which a dummy polysilicon gate stack is built on a substrate and removed after source and drain regions are formed. FIGS. 1A–1C are schematic illustrations of the dummy gate structure, which is the starting point for the embodiments of the invention described herein. FIG. 1A is a plan view of structure 10, which includes p+ polysilicon gate 11 and n+ polysilicon gate 12. As shown in FIG. 1A, the n+ and p+ regions are in contact; this structure is typically found in SRAM devices. Layers of nitride 13 and HDP oxide 14 have been deposited over the gate regions and planarized, so that the gate regions 11, 12 are exposed. (In these embodiments of the invention, oxide region 14 is preferably HDP oxide rather than BPSG, in order to permit processing at lower temperatures.) FIG. 1B is a longitudinal cross-section view, showing that the dummy gate regions 11, 12 are formed on a sacrificial gate oxide layer 15 overlying substrate 1. FIG. 1C is a transverse cross-section view, showing the nitride 13 and HDP oxide 14 on either side of the dummy polysilicon gate.

After the dummy gate and sacrificial gate oxide are removed, a layer of metal (thick enough to provide the desired work function) is deposited in the resulting trench, and the trench is filled with a suitable material such as undoped polysilicon. A polysilicon fill may then be converted to a silicide to provide a contact to the metal gate.

The metal gate structure may be either a single-metal gate with a midgap work function or a dual metal gate with different work functions for the n+ and p+ gate regions, as detailed below.

First Embodiment: Single-metal Replacement Gate

Figure 2A:
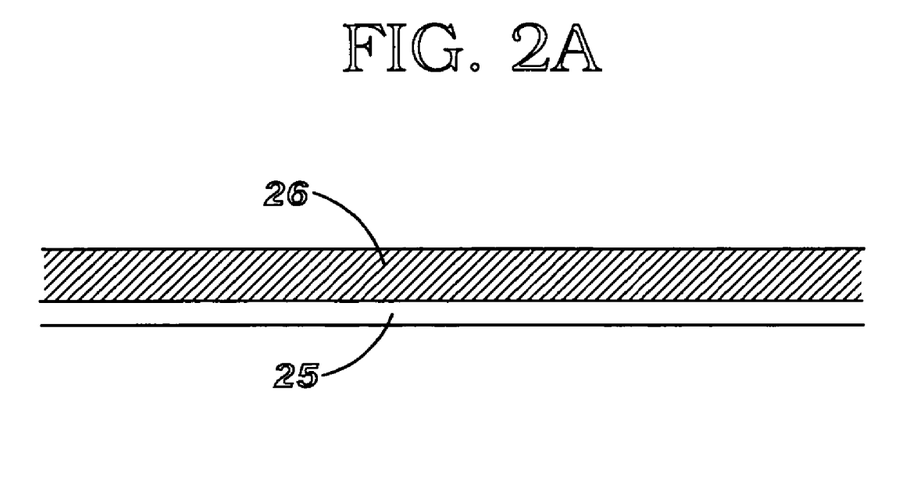
FIGS. 2A and 2B are longitudinal and transverse cross-section views, respectively, of a step in a midgap replacement gate process, in accordance with a first embodiment of the invention.
Figure 2B:
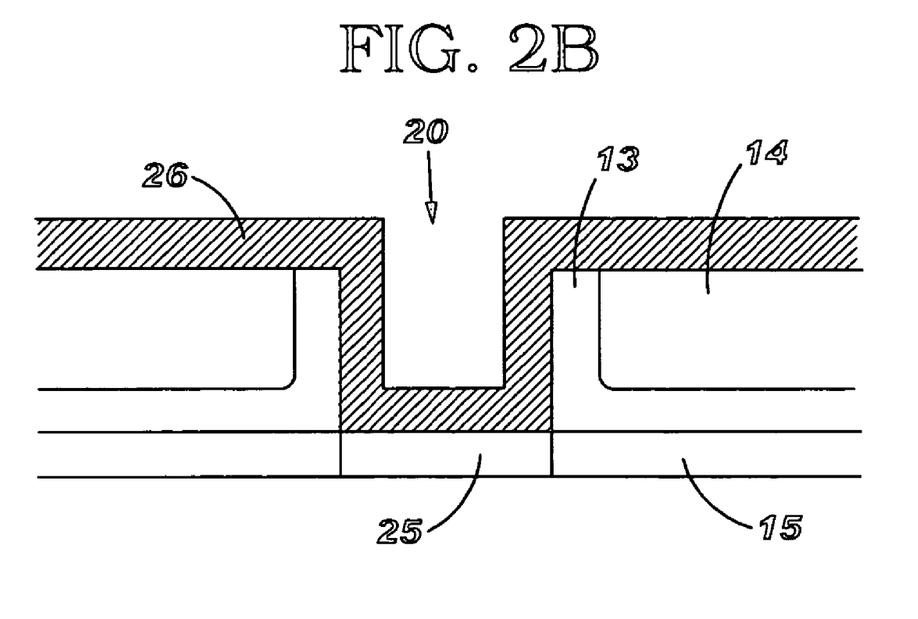

In this embodiment, the dummy polysilicon gate structures 11, 12 are removed in the same process; any convenient process having selectivity to nitride 13 and oxide 14 may be used. This process exposes the sacrificial oxide layer 15, which is then also removed. A trench 20 is thus formed with sidewalls 13a, 13b of nitride and an exposed portion of substrate 1 on the bottom. A new gate dielectric 25 is formed on the exposed substrate, either by a deposition process or a thermal growth process. A conformal layer of metal 26 is then deposited as a blanket layer, covering the sidewalls of the trench and the gate dielectric 25. The composition and thickness of layer 26 are chosen to provide the desired work function, as is understood by those skilled in the art. FIGS. 2A and 2B are longitudinal and transverse cross-section views, respectively, of the structure after metal layer 26 is deposited.

Figure 3A:
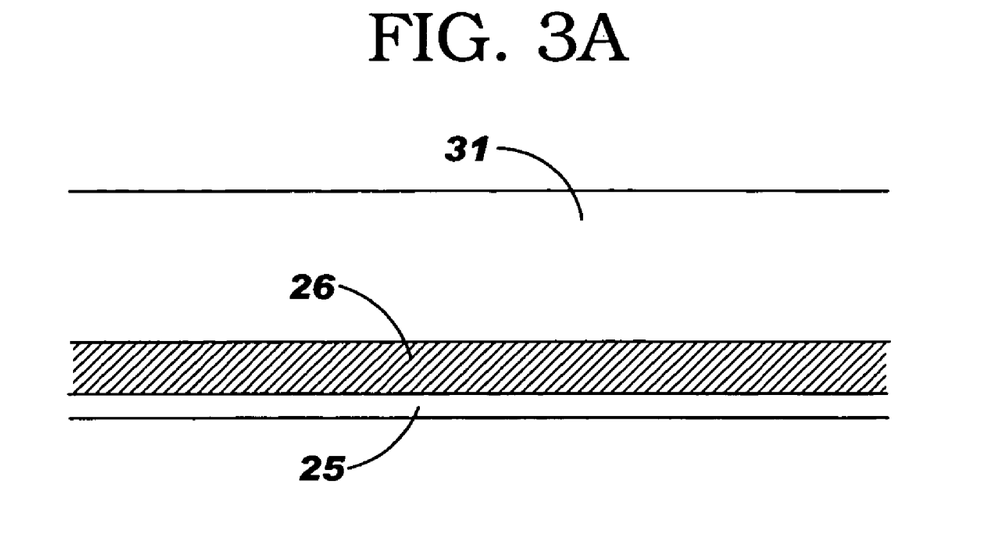
FIGS. 3A and 3B are longitudinal and transverse cross-section views, respectively, of a further step in a midgap replacement gate process, in accordance with the first embodiment of the invention.
Figure 3B:
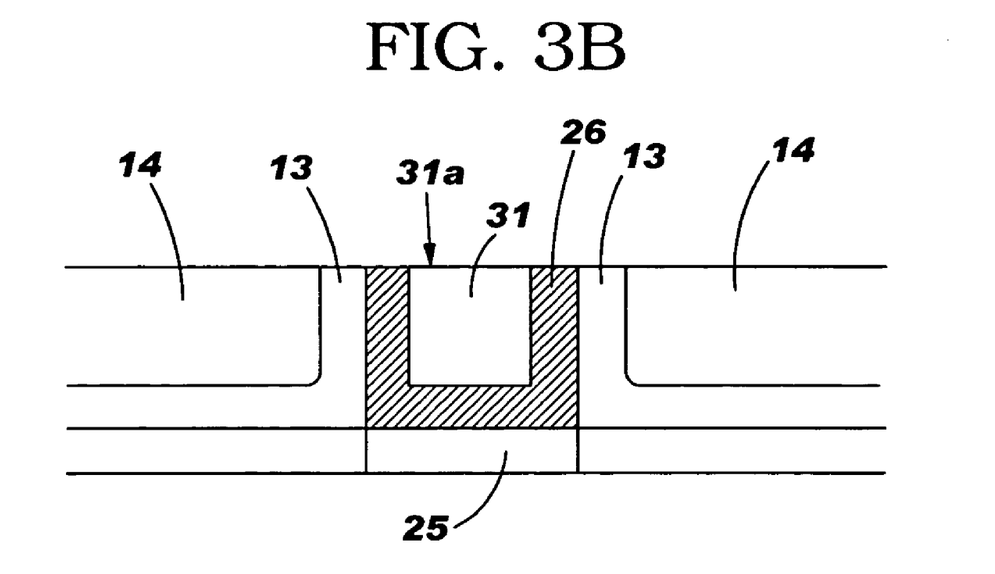

A blanket layer 31 of undoped polycrystalline or amorphous silicon is then deposited over layer 26, with sufficient thickness to fill trench 20. The internal composition of layer 31 is chosen to provide the optimum trench fill; for example, it has been found that a mixture of polysilicon and amorphous silicon has desirable fill properties. Layers 31 and 26 are then planarized, preferably by CMP, so that the oxide region 14 is again exposed and the top surface 31a of the trench fill material is coplanar therewith. The resulting structure is shown in FIG. 3A (longitudinal cross-section) and FIG. 3B (transverse cross-section).

Figure 4A:
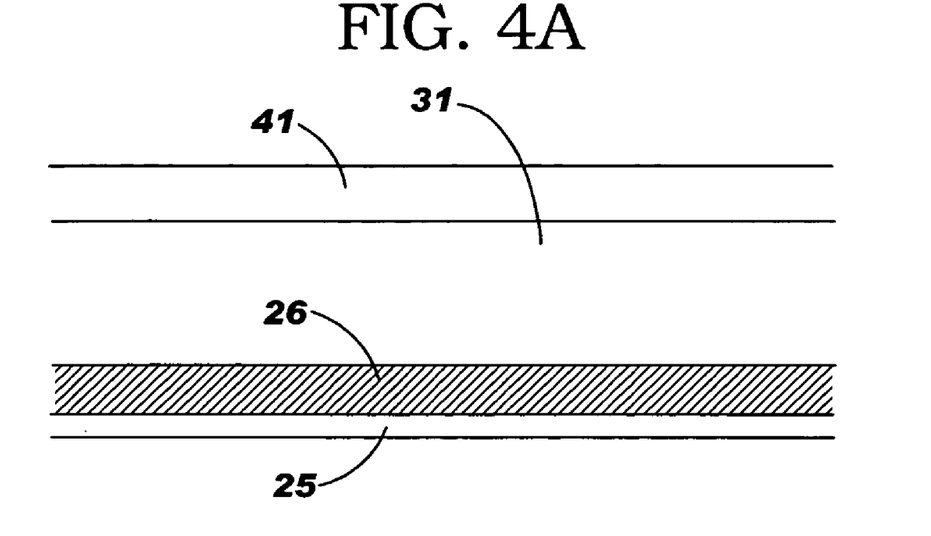
FIGS. 4A and 4B are longitudinal and transverse cross-section views, respectively, of a further step in a midgap replacement gate process, in accordance with the first embodiment of the invention.
Figure 4B:
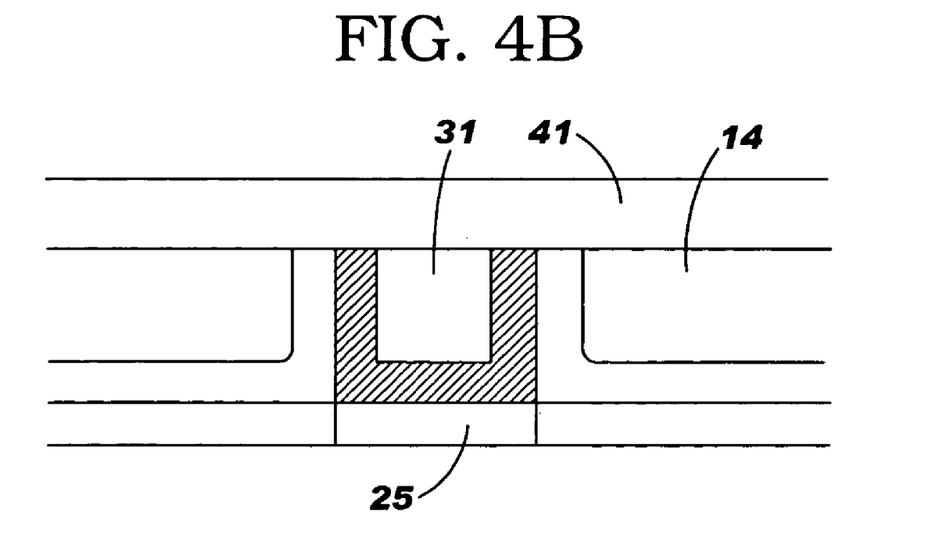
Figure 5A:
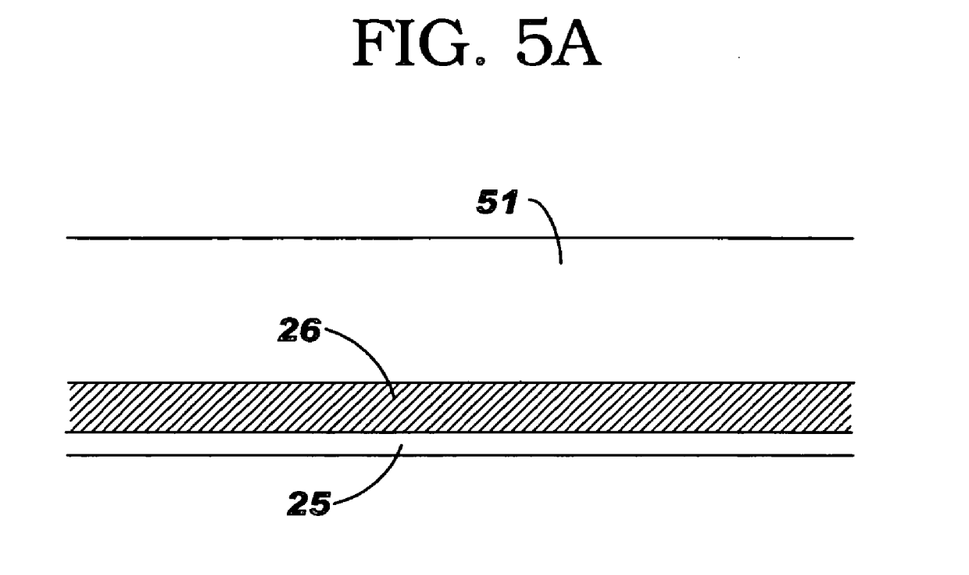
FIGS. 5A and 5B are longitudinal and transverse cross-section views, respectively, of an additional step in a midgap replacement gate process, in accordance with the first embodiment of the invention.
Figure 5B:
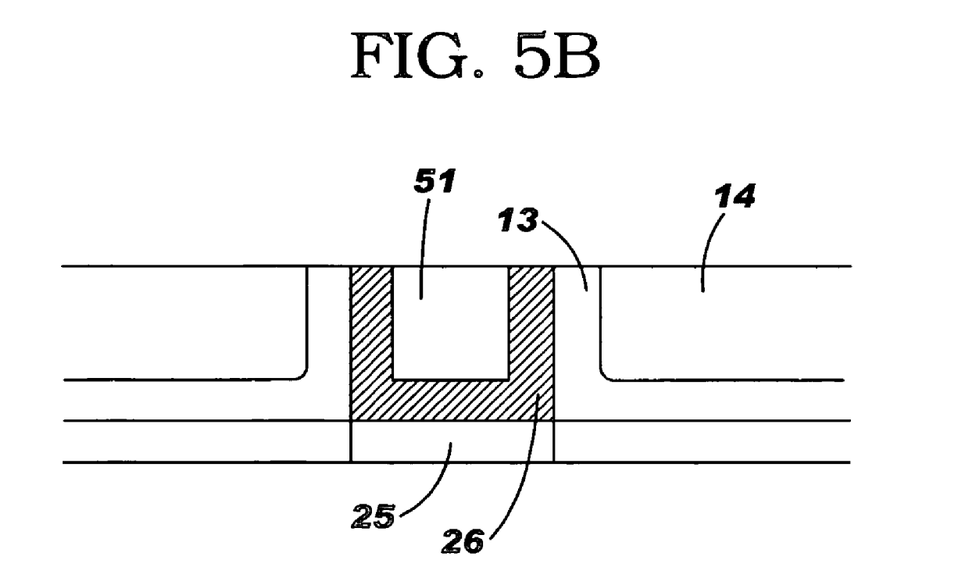

A blanket layer 41 of metal, suitable for forming a silicide, is then deposited (FIGS. 4A, 4B). This metal may be Co, Ta, W, Mo or (preferably) Ni. A silicidation process is then performed (details of which are known in the art), so that the trench fill material is converted to a silicide 51. Another planarization process is performed to again expose the original top surface of the structure (see FIGS. 5A and 5B). The dummy gate structure is thus replaced by a single-metal gate with a silicide contact thereto (compare FIGS. 1C and 5B).

It will be appreciated that this process does not require masking of any layer, and is accordingly easy to implement.

Second Embodiment: Dual-metal Replacement Gate

Figure 6:
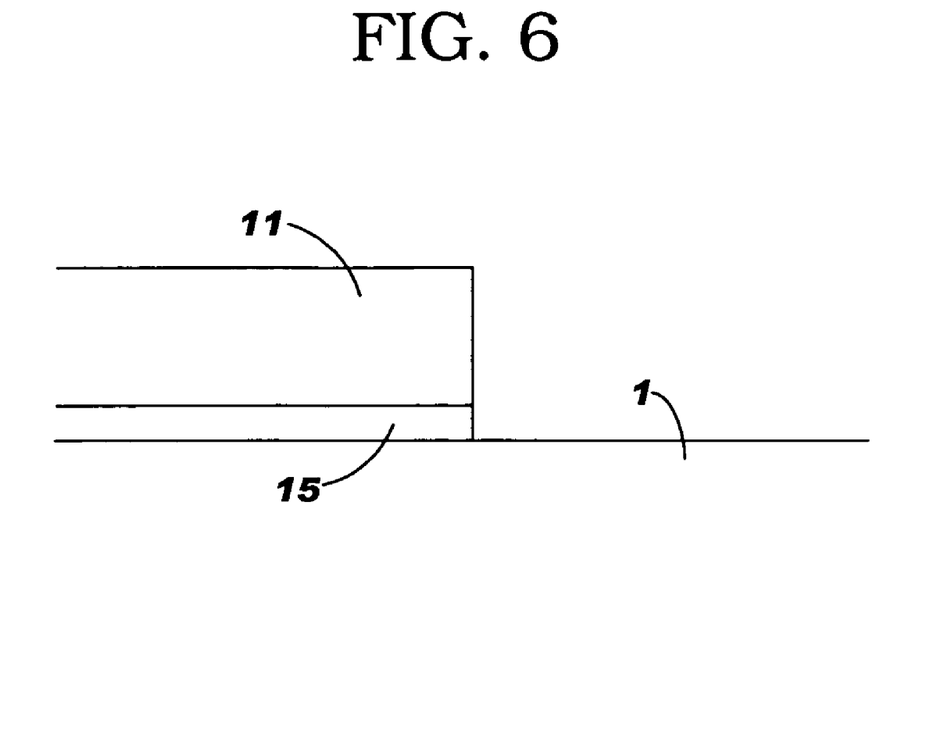
FIGS. 6–9 schematically illustrate steps in a dual-metal replacement gate process, in accordance with a second embodiment of the invention.
Figure 7:
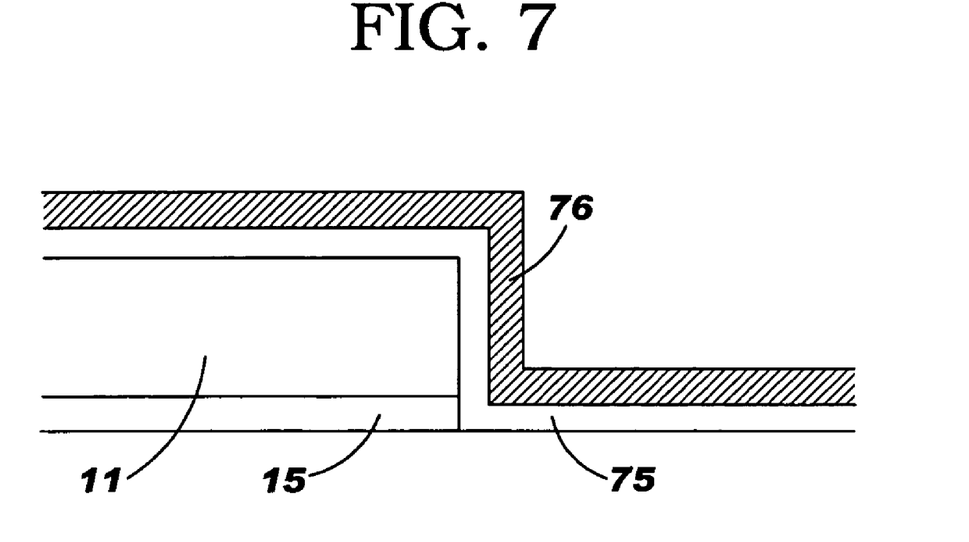

In this embodiment, the dummy p+ and n+ polysilicon gate structures are removed separately, which requires masking of the polysilicon structure not being removed. FIG. 6 shows the structure after masking the p+ dummy gate 11, removing the n+ dummy gate 12 and the underlying sacrificial gate oxide 15, and stripping the mask. A portion of the substrate 1 is thereby exposed. A blanket gate dielectric layer 75 is then grown or deposited, and a blanket metal layer 75 is deposited thereover (see FIG. 7).

Figure 8:
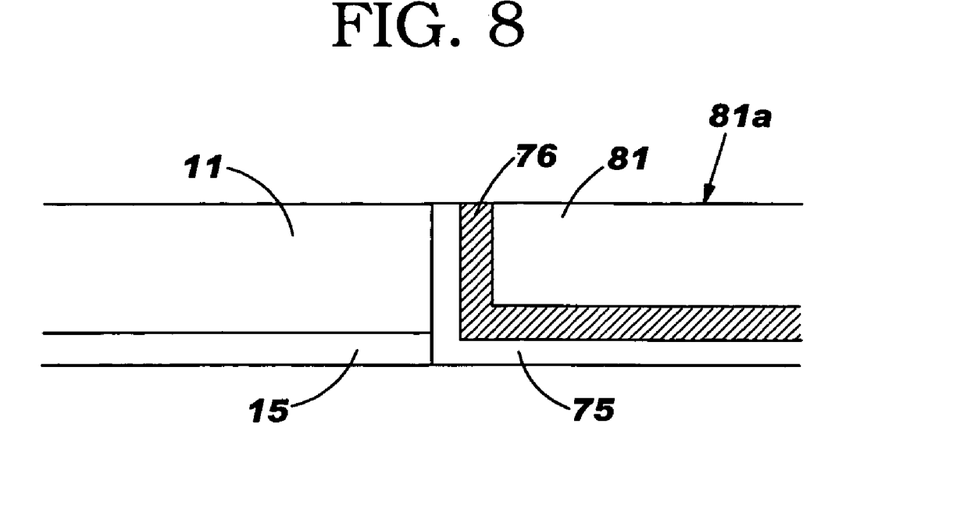

A blanket layer 81 of undoped polycrystalline or amorphous silicon is then deposited over layer 26. As in the first embodiment, the composition of layer 81 is chosen to provide the optimum trench fill. The structure is then planarized to again expose dummy gate 11, so that the top surface 81a of the fill material 81 is coplanar therewith. The planarization process may be performed in a single step, e.g. CMP of the poly/amorphous silicon, continuing with CMP of the metal layer 76 endpointing on the surface of poly-Si gate 11. Alternatively, the planarization process may be performed in two steps, e.g. CMP of the poly/amorphous silicon endpointing on metal layer 76 overlying poly-Si gate 11, followed by a separate metal removal process. The resulting structure, after planarization, is shown in FIG. 8.

Figure 9:
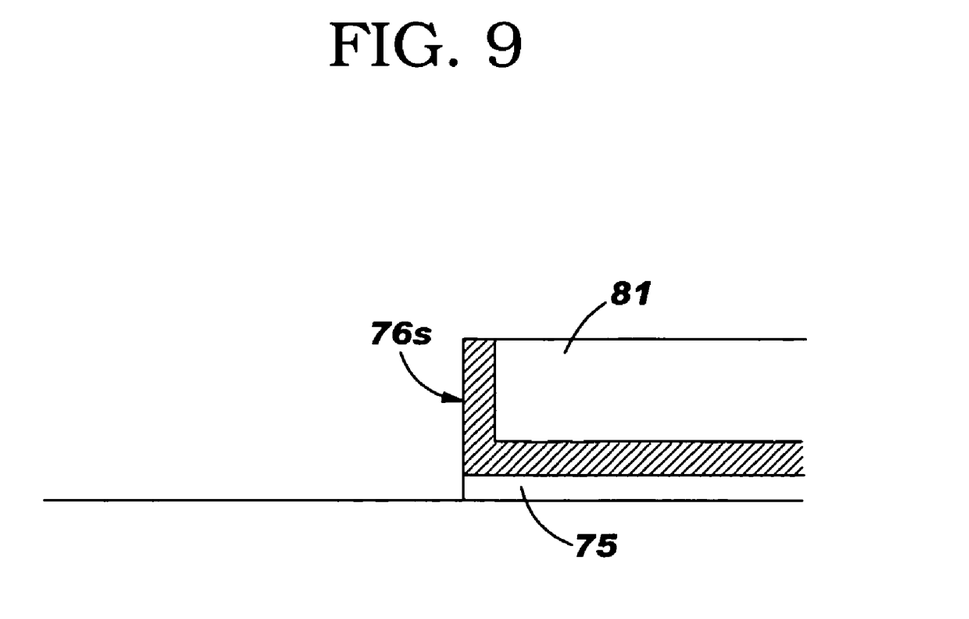

The structure is then masked to permit removal of the dummy p+ polysilicon gate 11. The dummy p+ polysilicon gate 11 is removed along with the remaining sacrificial gate oxide 15. During the removal of the sacrificial oxide, a portion of the gate dielectric layer 75 covering the sidewall 76s of the metal is also removed. FIG. 9 shows the structure after these steps and after the mask is removed; note that the metal sidewall 76s is exposed.

Figure 10A:
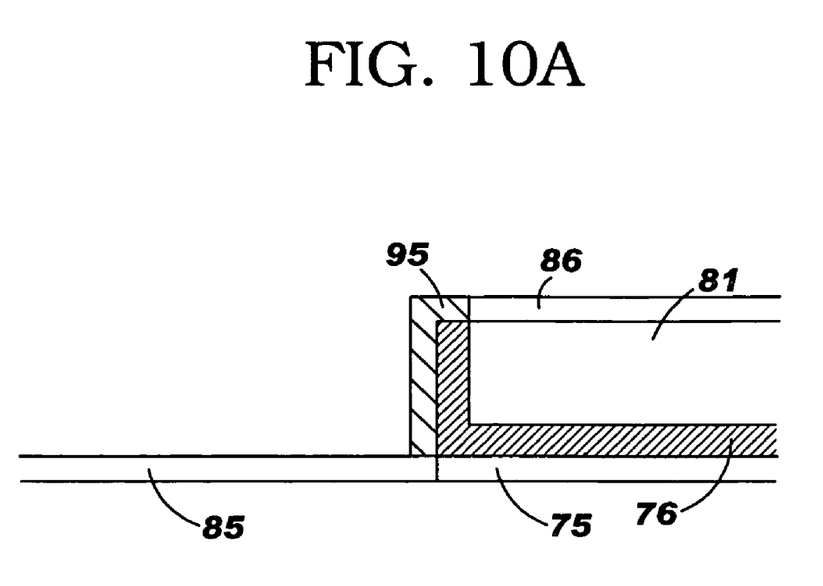
FIGS. 10A and 10B schematically illustrate further steps in a dual-metal replacement gate process, in accordance with the second embodiment of the invention.

An oxidation process is then performed on the exposed silicon surfaces, so that an oxide layer 85 is formed on the exposed portion of the substrate and an oxide 86 is formed on the surface of poly/amorphous silicon layer 81. The oxidation process typically includes a rapid thermal anneal (RTA) to about 900° C., so that an oxide layer 95 is formed on the exposed surfaces of metal layer 76 (see FIG. 10A). The gate dielectric layer 88 underlying the dual-metal gate is thus composed of layers 75 and 85, formed in separate steps.

Figure 10B:
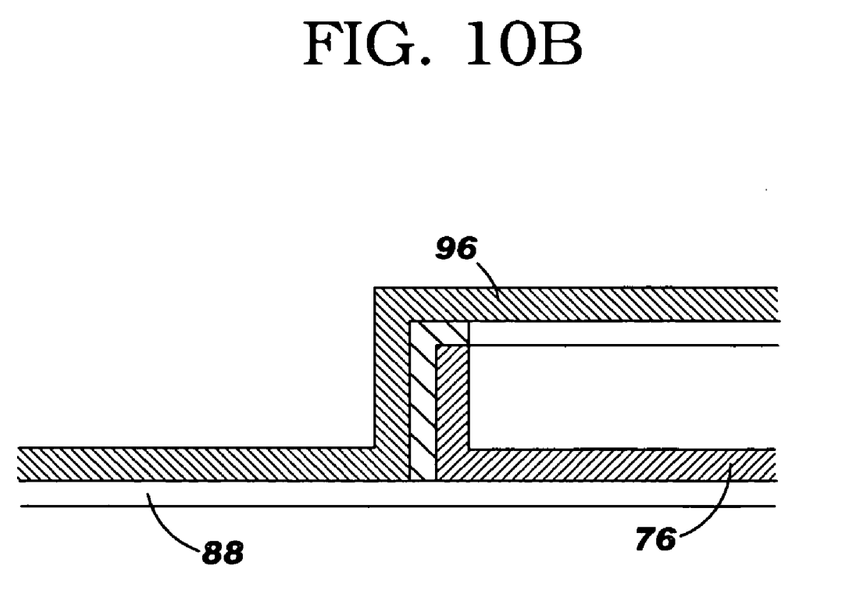
Figure 11A:
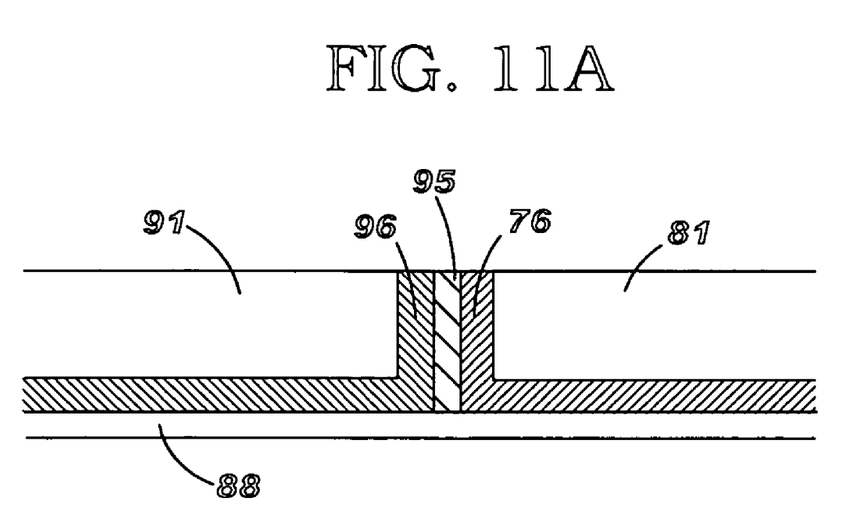
FIGS. 11A and 11B are longitudinal and transverse cross-section views, respectively, of a further step in a dual-metal replacement gate process, in accordance with the second embodiment of the invention.

A second blanket metal layer 96 is then deposited, as shown in FIG. 10B. As in the previous steps, this blanket metal layer has a layer 91 of undoped polycrystalline or amorphous silicon deposited thereon. The structure is then planarized to yield the structure shown in FIG. 11A (longitudinal cross-section) and FIG. 11B (transverse cross-section). A comparison of FIGS. 11A and 11B with FIGS. 1B and 1C, respectively, shows that the dummy gate and sacrificial gate oxide have been replaced with a dual-metal gate with an underlying gate dielectric.

Figure 12A:
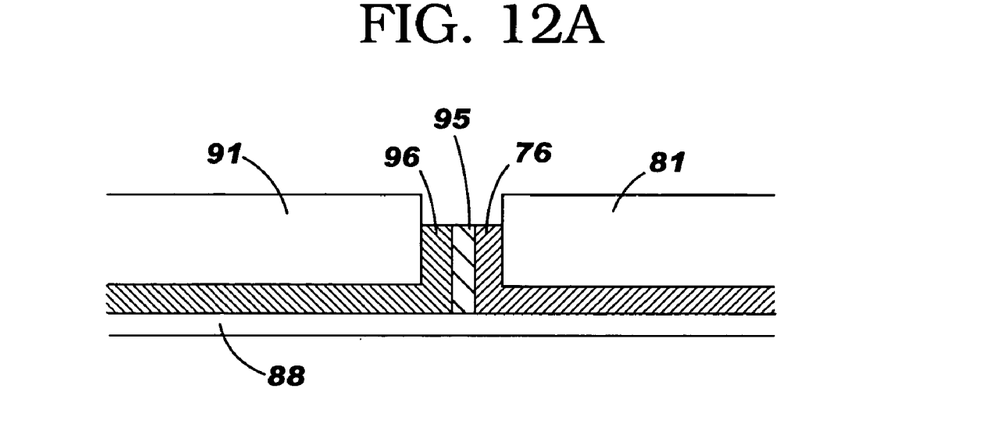
FIGS. 12A and 12B are longitudinal and transverse cross-section views, respectively, of an additional step in a dual-metal replacement gate process, in accordance with the second embodiment of the invention.
Figure 12B:
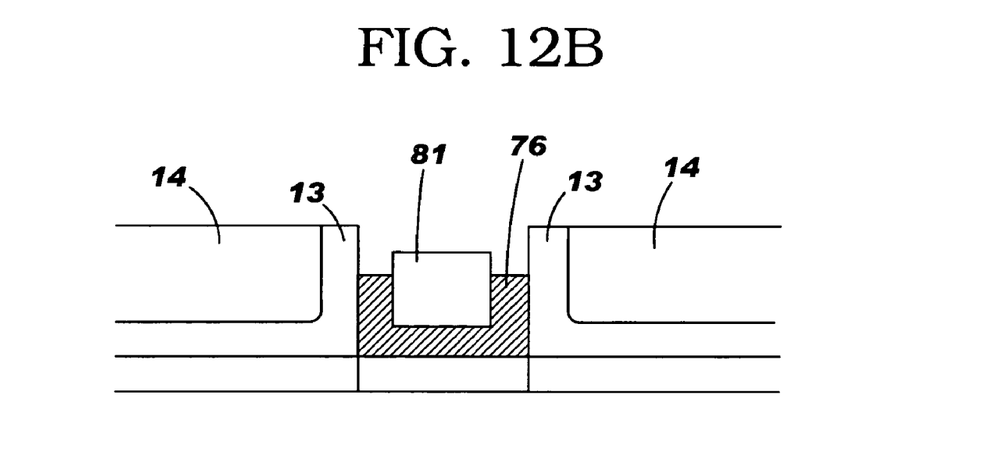

An etchback process is then performed which causes the gate region to be recessed with respect to the nitride region 13 and oxide region 14. Specifically, silicon layers 81, 91 are recessed relative to the oxide 14, and metal oxide 95 and metal layers 76, 96 are recessed relative to the silicon layers 81, 91. A number of possible etch processes may be used, as is understood by those skilled in the art. The result of the etchback process is shown in FIG. 12A (longitudinal cross-section) and FIG. 12B (transverse cross-section).

Figure 11B:
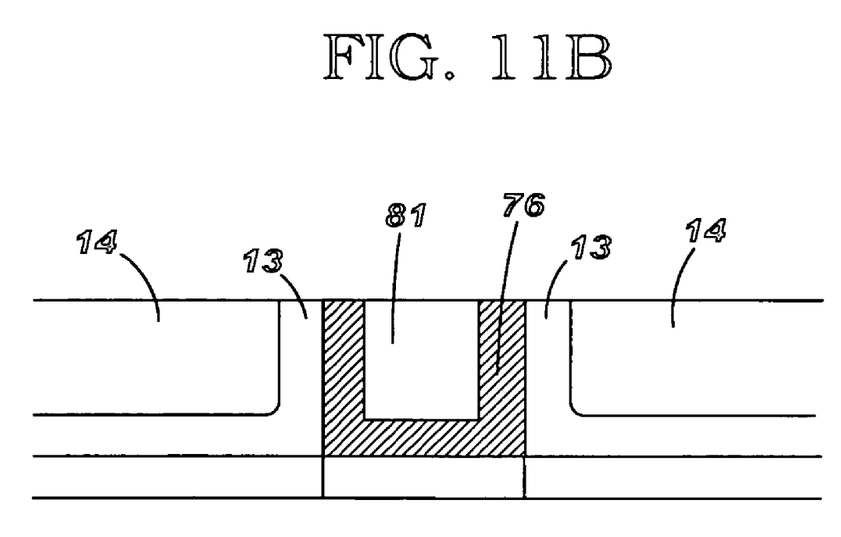
Figure 13:
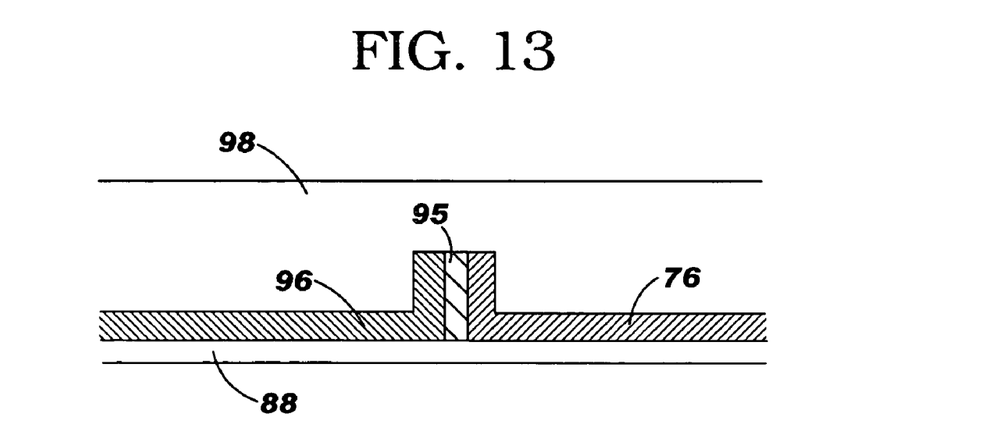
FIG. 13 illustrates a further step in a dual-metal replacement gate process, in accordance with the second embodiment of the invention.
Figure 14A:
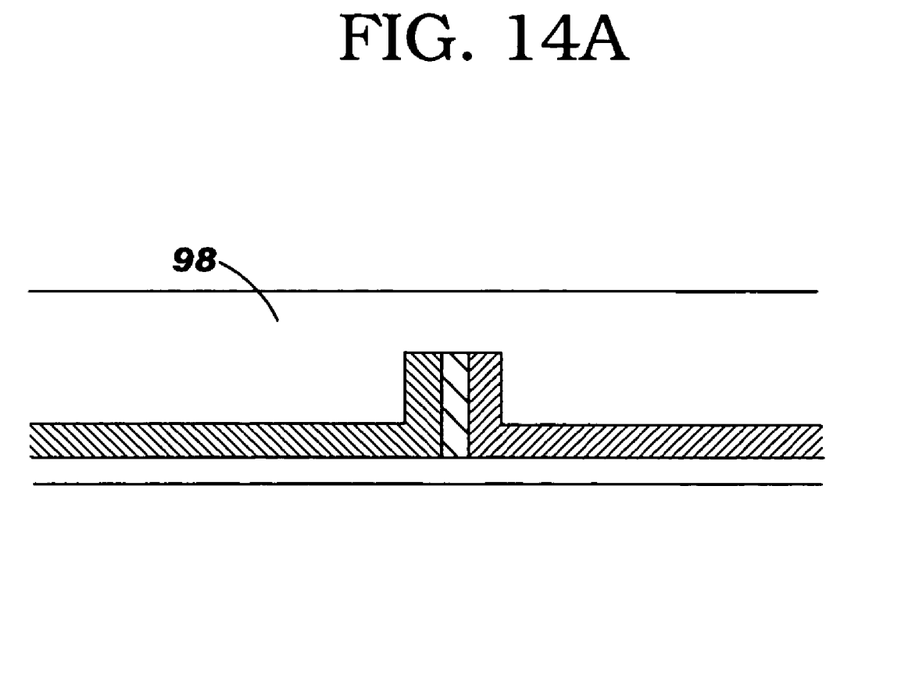
FIGS. 14A and 14B are longitudinal and transverse cross-section views, respectively, of a further step in a dual-metal replacement gate process, in accordance with the second embodiment of the invention.
Figure 14B:
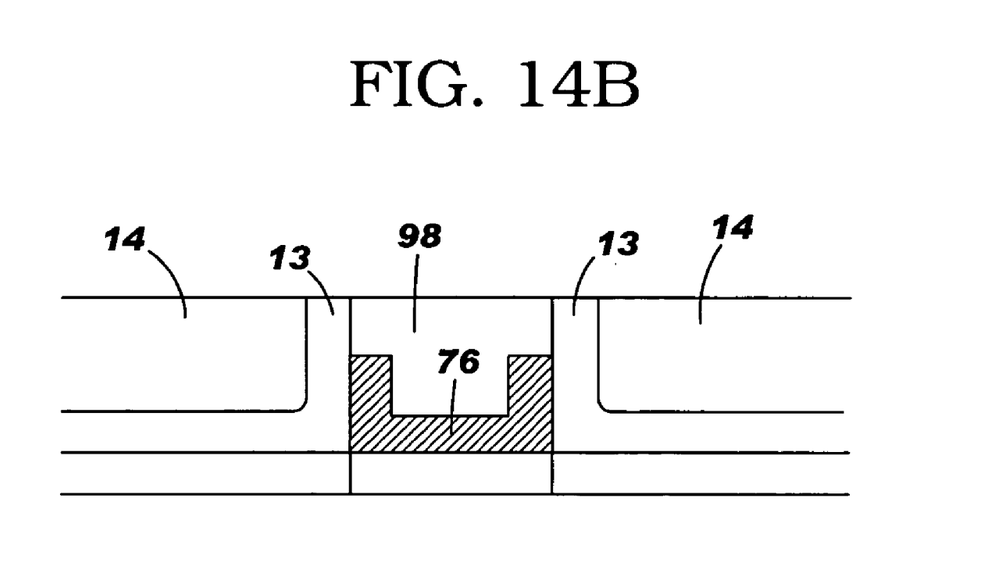
Figure 15:
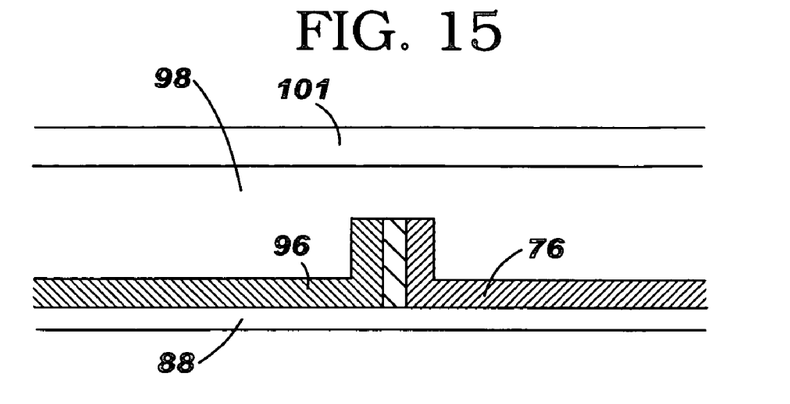
FIG. 15 illustrates an additional step in a dual-metal replacement gate process, in accordance with the second embodiment of the invention.

A blanket layer of polycrystalline silicon is then deposited, so that a continuous silicon layer 98 overlies the dual-metal gate (FIG. 13). This layer is planarized by RIE or CMP (or a combination thereof) so that nitride layer 13 and oxide layer 14 are again exposed. The resulting structure is shown in FIG. 14A (longitudinal cross-section) and FIG. 14B (transverse cross-section). At this point the dual-metal gate is recessed beneath a region of silicon whose top surface is coplanar with the surrounding dielectric materials (FIG. 14B; compare with FIG. 11B).

Figure 16A:
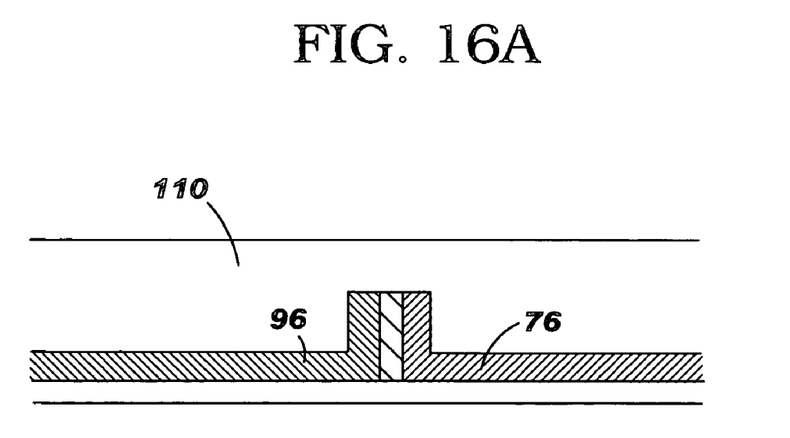
FIGS. 16A and 16B are longitudinal and transverse cross-section views, respectively, of another step in a dual-metal replacement gate process, in accordance with the second embodiment of the invention.
Figure 16B:
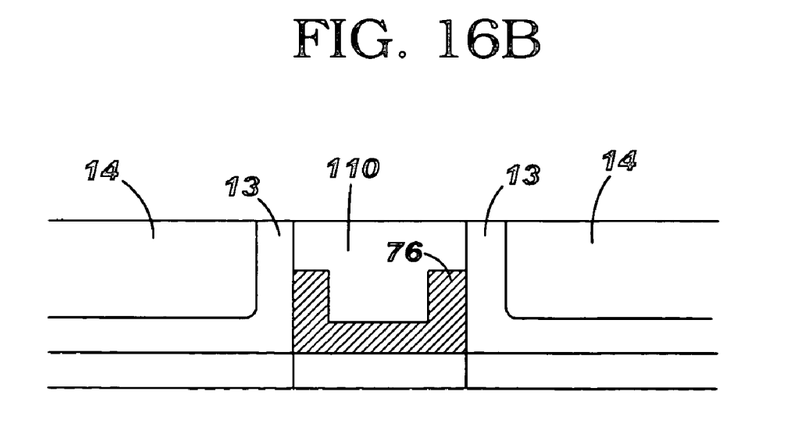
Figure 17A:
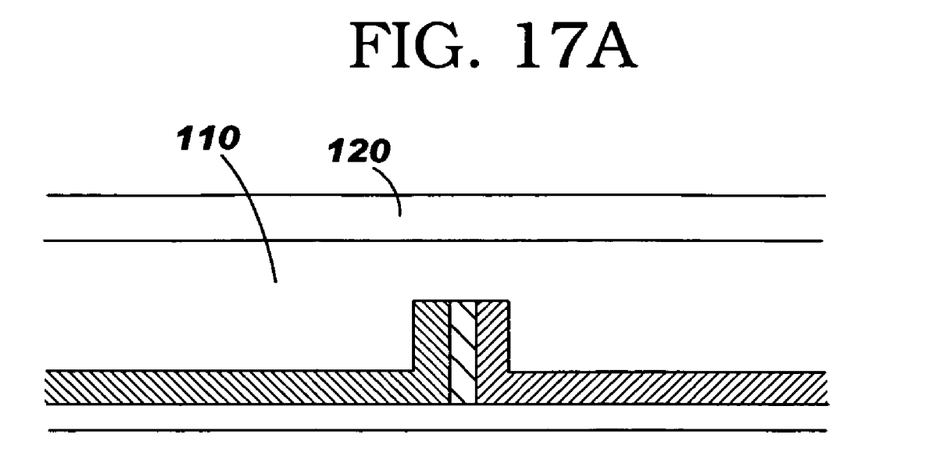
FIGS. 17A and 17B are longitudinal and transverse cross-section views, respectively, of an additional step in a dual-metal replacement gate process, in accordance with the second embodiment of the invention.
Figure 17B:
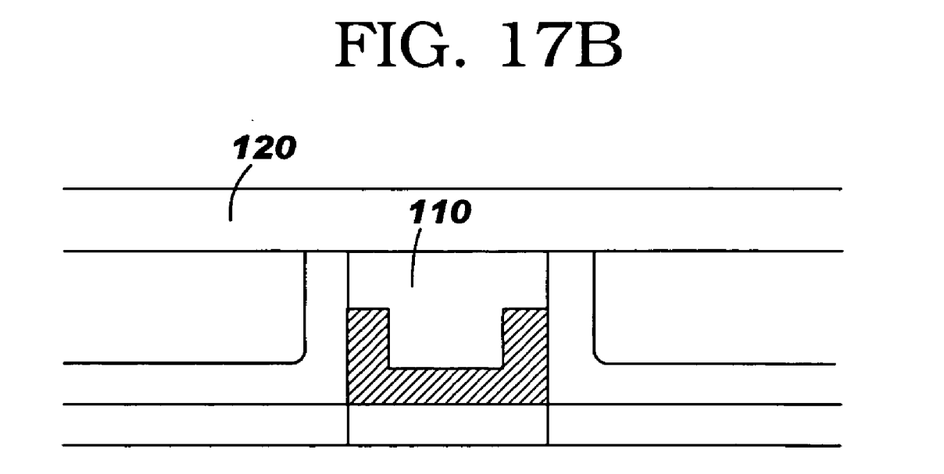
Figure 18A:
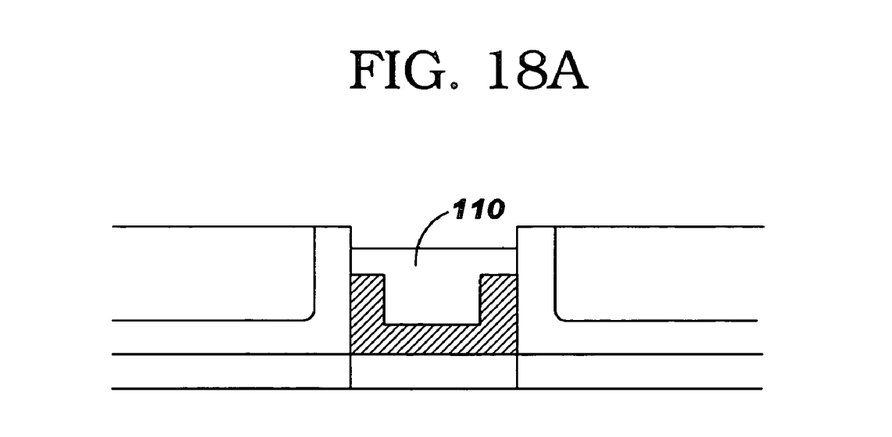
FIGS. 18A–18C are transverse cross-section views of additional step in a dual-metal replacement gate process, as an alternative to the steps of FIGS. 17A and 17B.
Figure 18B:
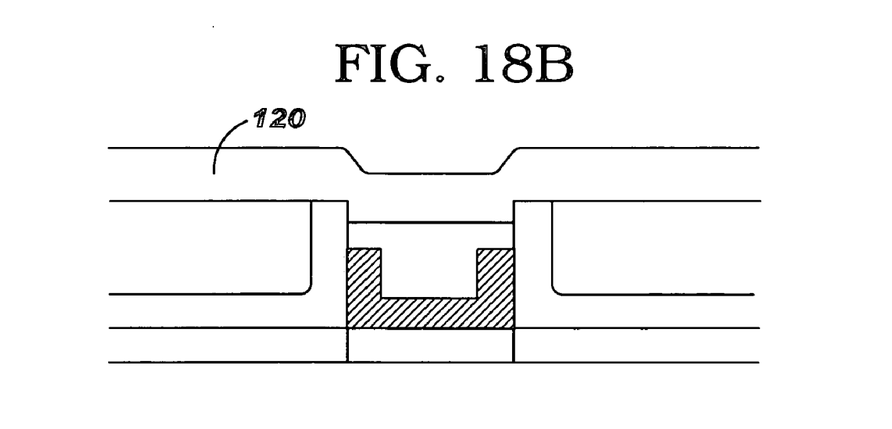
Figure 18C:
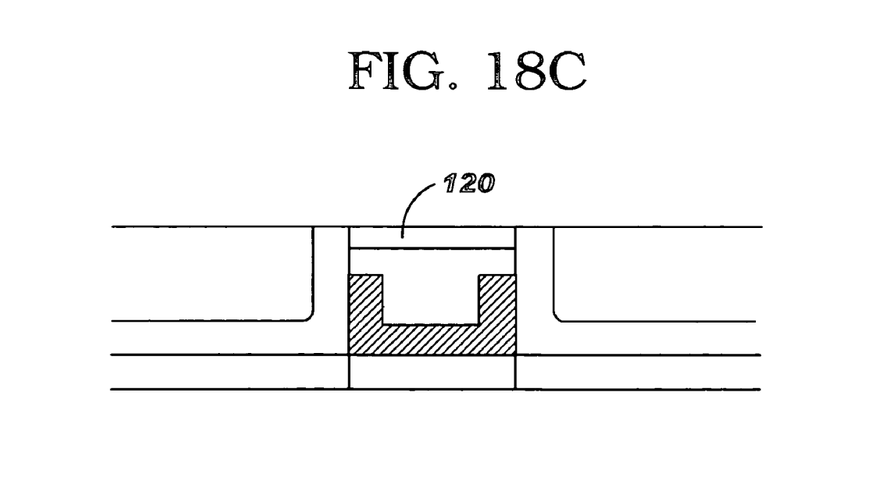

In this embodiment, a dual-metal gate structure is formed with a silicide contact thereto. It is advantageous to also provide a nitride cap layer for the structure, which permits annealing without affecting the metal or silicide. (In a preferred embodiment, the silicide is $NiSi_2$ and the annealing is done in forming gas. With a nitride cap, an anneal in forming gas at 400° C. may be used to remove excess charge between the metal gate and the gate oxide, thereby preventing a shift in threshold voltage.) A nitride cap layer 120 may be deposited as a blanket layer, as shown in FIG. 17A (longitudinal cross-section) and FIG. 17B (transverse cross-section). Alternatively, the silicide layer 110 may be recessed (FIG. 18A; compare FIG. 16B), so that nitride layer 120 fills the recess (FIG. 18B). Nitride layer 120 may then be planarized so that only the portion thereof overlying the silicide contact remains (FIG. 18C). The nitride cap is then self-aligned to the dual-metal gate and silicide contact.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

The invention claimed is:

1. A method for fabricating a semiconductor device having a gate structure on a substrate, the gate structure being adjacent to a dielectric material having a top surface, the method comprising the steps of:
    removing material in a gate region of the device to expose a portion of the substrate;
    forming a gate dielectric on the exposed portion of the substrate;
    forming a metal layer overlying the gate dielectric and the dielectric material;
    forming a silicon layer overlying the metal layer;
    removing a first portion of the metal layer and a first portion of the silicon layer, so that the top surface of the dielectric material is exposed and a second portion of the metal layer and a second portion of the silicon layer remain in the gate region and have surfaces coplanar with said top surface; and
    forming a silicide contact in the gate region, in contact with the second portion of the metal layer.

2. A method according to claim 1, wherein said step of forming a silicide contact further comprises:
    depositing a layer of a silicide-forming metal over the gate region;
    performing a siliciding process to form a metal silicide including silicon from the second portion of the silicon layer and metal from said layer of silicide-forming metal; and
    performing a planarization process to expose the top surface of the dielectric material.

3. A method according to claim 1, wherein the silicide-forming metal is selected from the group consisting of Ni, Co, Ta, W and Mo.

4. A method according to claim 1, wherein
    said step of removing material in the gate region forms a trench having sidewalls and a bottom, the bottom being the exposed portion of the substrate,
    said step of forming the metal layer further comprises forming metal on the sidewalls of the trench, and
    said step of forming the silicon layer comprises filling the trench.

5. A method according to claim 1, wherein the semiconductor device is fabricated on a wafer, said step of forming the metal layer comprises forming a blanket metal layer on the wafer, and said step of forming the silicon layer comprises forming a blanket silicon layer on the wafer.

6. A method for fabricating a semiconductor device having a gate structure on a substrate, the gate structure being adjacent to a dielectric material having a top surface, the method comprising the steps of:
removing material in a first portion of a gate region of the device to expose a first portion of the substrate;
forming a first gate dielectric on the exposed first portion of the substrate;
forming a first metal layer overlying the first gate dielectric;
forming a first silicon layer overlying the first metal layer;
removing a first portion of the first metal layer and a first portion of the first silicon layer, so that the top surface of the dielectric material is exposed and a second portion of the first metal layer and a second portion of the first silicon layer remain in the gate region and have surfaces coplanar with said top surface;
removing material in a second portion of the gate region to expose a second portion of the substrate and to expose an adjacent portion of the first metal layer;
forming a second gate dielectric on the exposed second portion of the substrate;
forming an oxide layer on said exposed adjacent portion of the first metal layer;
forming a second metal layer overlying the second gate dielectric;
forming a second silicon layer overlying second metal layer;
removing a first portion of the second metal layer and a first portion of the second silicon layer, so that the top surface of the dielectric material is exposed and a second portion of the second metal layer and a second portion of the second silicon layer remain in the gate region and have surfaces coplanar with said top surface; and
forming a silicide contact in the gate region, in contact with the second portion of the first metal layer and the second portion of the second metal layer.

7. A method according to claim 6, wherein said step of forming a silicide contact further comprises:
forming a third silicon layer overlying the first portion of the gate region and the second portion of the gate region;
depositing a layer of a silicide-forming metal over the third silicon layer;
performing a siliciding process to form a metal silicide including silicon from the second portion of the first silicon layer, from the second portion of the second silicon layer and from the third silicon layer, and metal from said layer of silicide-forming metal; and
performing a planarization process to expose the top surface of the dielectric material.

8. A method according to claim 6, wherein the silicide-forming metal is selected from the group consisting of Ni, Co, Ta, W and Mo.

9. A method according to claim 6, wherein
said step of removing material in the first portion of the gate region forms a first trench having sidewalls and a bottom, the bottom being the exposed first portion of the substrate,
said step of forming the first metal layer further comprises forming metal on the sidewalls of the first trench,
said step of forming the first silicon layer comprises filling the first trench,
said step of removing material in the second portion of the gate region forms a second trench having sidewalls and a bottom, the bottom being the exposed second portion of the substrate,
said step of forming the second metal layer further comprises forming metal on the sidewalls of the second trench, and
said step of forming the second silicon layer comprises filling the second trench.

10. A method according to claim 6, wherein the semiconductor device is fabricated on a wafer, said step of forming the first metal layer comprises forming a first blanket metal layer on the wafer, said step of forming the first silicon layer comprises forming a second blanket silicon layer on the wafer, said step of forming the second metal layer comprises forming a second blanket metal layer on the wafer, and said step of forming the second silicon layer comprises forming a second blanket silicon layer on the wafer.

11. A method according to claim 6, further comprising the step of:
prior to said step of forming a silicide contact, removing metal and metal oxide so that the second portion of the first metal layer, the oxide layer and the second portion of the second metal layer are recessed with respect to said top surface.

12. A method according to claim 7, further comprising the step of:
prior to said step of forming a silicide contact, removing metal and metal oxide so that the second portion of the first metal layer, the oxide layer and the second portion of the second metal layer are recessed with respect to said top surface, thereby forming a recess in the gate region; and wherein said step of forming the third silicon layer further comprises filling the recess.

13. A method according to claim 12, wherein said step of forming the silicide contact causes the silicide to fill the recess.

14. A method according to claim 6, further comprising the step of forming a nitride layer overlying the gate region, after said step of forming the silicide contact.

15. A method according to claim 6, where said silicide contact is recessed with respect to said top surface, thereby forming a recess in the gate region, and further comprising the steps of:
forming a nitride layer overlying the gate region and filling said recess; and
performing a planarization process to expose said top surface, so that a portion of the nitride layer remains in said recess and has a surface coplanar with said top surface.

16. A semiconductor device having a gate structure on a substrate, the gate structure being adjacent to a dielectric material having a top surface, the device comprising:
a gate dielectric overlying a portion of the substrate in a gate region and in contact therewith;
a metal layer in contact with the gate dielectric; and
a silicide contact having a lower surface in contact with the metal layer and an upper surface coplanar with said top surface.

17. A semiconductor device according to claim 16, wherein the gate region is characterized as a trench having a bottom and sidewalls, the gate dielectric overlies the bottom of the trench, the metal layer is in contact with the sidewalls of the trench, and the silicide contact fills the trench.

18. A semiconductor device according to claim 16, wherein the metal layer comprises a first metal layer and a second metal layer, and further comprises a metal oxide layer between the first metal layer and the second metal layer.

19. A semiconductor device according to claim 16, further comprising a nitride layer overlying the silicide contact.

20. A semiconductor device according to claim 16, wherein the silicide contact comprises:

a silicide portion having an upper surface recessed with the respect to said top surface; and a nitride cap portion overlying the silicide portion and having an upper surface coplanar with said top surface, the nitride cap portion being self-aligned to the gate region.

* * * * *